United States Patent
Xu et al.

(10) Patent No.: US 9,321,630 B2
(45) Date of Patent: Apr. 26, 2016

(54) SENSOR WITH VACUUM-SEALED CAVITY

(71) Applicants: PGS Geophysical AS, Lysaker (NO); **Agency for Science Technology and Research (A*STAR)**, Connexis (SG)

(72) Inventors: Jinghui Xu, Singapore (SG); Julius Ming-Lin Tsai, Singapore (SG); Winston Sun, Singapore (SG); Chengliang Sun, Singapore (SG)

(73) Assignees: PGS Geophysical AS, Oslo (NO); **Agency For Science Technology and Research (A*STAR)**, Connexis (SG)

( * ) Notice: Subject to any disclaimer, the term of this patent is extended or adjusted under 35 U.S.C. 154(b) by 586 days.

(21) Appl. No.: 13/772,183

(22) Filed: Feb. 20, 2013

(65) Prior Publication Data
US 2014/0230557 A1    Aug. 21, 2014

(51) Int. Cl.
*B81C 1/00* (2006.01)
*G01V 1/18* (2006.01)
*G01H 11/08* (2006.01)

(52) U.S. Cl.
CPC ............ *B81C 1/00182* (2013.01); *G01H 11/08* (2013.01); *G01V 1/186* (2013.01); *B81B 2201/0257* (2013.01)

(58) Field of Classification Search
CPC .......... B81C 1/00182; B81C 1/00158; G01V 1/186; G01H 11/08; B81B 2201/0257; B81B 2201/0264
USPC .............. 73/645, 651, 632; 181/110, 148; 367/14, 153, 154, 155, 157, 163, 165, 367/174
See application file for complete search history.

(56) References Cited

U.S. PATENT DOCUMENTS 3,688,251 A * 8/1972 Morris ................... G01V 1/181
                                                       310/329
4,216,401 A * 8/1980 Wagner ................. G01L 9/0025
                                                       310/313 R
(Continued)

FOREIGN PATENT DOCUMENTS

CN          102305626 A    1/2012
EP            1764597 A1    3/2007
(Continued)

OTHER PUBLICATIONS

Search Report issued by the United Kingdom Intellectual Property Office for patent application GB1402846.8, Mailed on Aug. 4, 2014, 7 pages.
(Continued)

*Primary Examiner* — Laura Martin
*Assistant Examiner* — Rose M Miller
(74) *Attorney, Agent, or Firm* — Meyertons, Hood, Kivlin, Kowert & Goetzel, P.C.

(57) ABSTRACT

A method and apparatus for detecting underwater sounds is disclosed. An embodiment of the apparatus includes a substrate with a vacuum-sealed cavity. A support structure and an acoustic pressure sensor are situated on the substrate. The support structure of the apparatus may include a first oxide layer situated on the substrate, a silicon layer situated on the first oxide layer, and a second oxide layer situated on the silicon layer. The acoustic pressure sensor of the apparatus includes a first electrode layer situated on the substrate, a piezoelectric layer situated on the first electrode layer, and a second electrode layer situated on the piezoelectric layer. In one embodiment, the surface area of the second electrode layer is between about 70 to 90 percent of the surface area of the piezoelectric layer. In various embodiments, the support structure is thicker than the piezoelectric layer.

21 Claims, 9 Drawing Sheets

(56) References Cited

U.S. PATENT DOCUMENTS

| | | | |
|---|---|---|---|
| 4,435,986 A * | 3/1984 | Choffat | G01L 9/0022 |
| | | | 73/702 |
| 5,394,379 A | 2/1995 | Weichart et al. | |
| 5,459,351 A * | 10/1995 | Bender | G01L 19/147 |
| | | | 257/417 |
| 5,774,417 A | 6/1998 | Corrigan et al. | |
| 5,982,708 A | 11/1999 | Pearce | |
| 6,109,113 A | 8/2000 | Chavan et al. | |
| 6,314,056 B1 | 11/2001 | Bunn et al. | |
| 7,974,152 B2 | 7/2011 | Tenghamn | |
| 8,035,393 B2 | 10/2011 | Tenghamn et al. | |
| 8,331,198 B2 | 12/2012 | Morozov et al. | |
| 8,441,892 B2 | 5/2013 | Morozov et al. | |
| 8,634,276 B2 | 1/2014 | Morozov et al. | |
| 2005/0057885 A1 | 3/2005 | Wong | |
| 2005/0193827 A1 | 9/2005 | Fischer et al. | |
| 2006/0086188 A1 | 4/2006 | Avramescu et al. | |
| 2008/0253225 A1 | 10/2008 | Welker et al. | |
| 2010/0254547 A1 | 10/2010 | Grosh et al. | |
| 2011/0120221 A1 | 5/2011 | Yoda | |
| 2012/0250456 A1 | 10/2012 | Tenghamn | |
| 2013/0208571 A1 | 8/2013 | Pearce et al. | |
| 2014/0180031 A1 * | 6/2014 | Anderson | A61B 8/0891 |
| | | | 600/301 |
| 2015/0145674 A1 * | 5/2015 | Rydfors | G06F 19/3418 |
| | | | 340/539.12 |

FOREIGN PATENT DOCUMENTS

| | | |
|---|---|---|
| EP | 2489629 A2 | 8/2012 |
| EP | 2557406 A1 | 2/2013 |
| EP | 2775309 A1 | 9/2014 |
| EP | 2778692 A1 | 9/2014 |
| GB | 2493838 A | 2/2013 |
| JP | 2012-185131 A | 9/2012 |
| WO | 0055638 A1 | 9/2000 |
| WO | 2008086448 A2 | 7/2008 |

OTHER PUBLICATIONS

English Abstract of JP2012185131, Publication Date: Sep. 27, 2012, 1 page.

UK Search Report issued in the prosecution of patent application No. GB1402846.8, mailed on Nov. 26, 2014, 3 pages.

Partial Search translation of CN102305626 from EPODOC/EPO, Publication Date: Jan. 4, 2012, 2 pages.

Tsai, J.M. and Fedder, G.K., "Mechanical noise-limited CMOS-MEMS accelerometers," 18th IEEE International Conference on Micro Electro Mechanical Systems, Jan.-Feb. 2005, pp. 630- 633.

Sungjoon Choi, Haksue Lee, Wonkyu Moon, "A micro-machined piezoelectric hydrophone with hydrostatically balanced air backing," Elsevier, 2010, pp. 60-71.

DIY Dunking Hydrophone Details, based off of Frank Watlington, "How to build and use low-cost hydrophones," 1979, 23 pages.

* cited by examiner

SENSOR WITH VACUUM-SEALED CAVITY

BACKGROUND

1. Technical Field

This disclosure relates generally to piezoelectric microelectromechanical system (MEMS) sensors, and, more particularly in some embodiments, a high performance piezoelectric MEMS hydrophone for underwater acoustic signal detection.

2. Description of the Related Art

Hydrophones are devices typically used to detect underwater sounds. They are widely used, for example, in marine oil and gas detection systems, sonar systems, underwater communication systems and diving equipment, etc. For example, in marine seismic exploration, hydrocarbon bearing formations may be located by generating acoustic source signals in a body of water, and then detecting acoustic signals that result, at least in part, from the acoustic source signals interacting with ground formations under the body of water. Many hydrophones include piezoelectric materials that, when deformed by the acoustic pressure of a sound wave, generate electricity. Electrodes may be used to detect generated electricity—the greater the acoustic pressure applied, the greater the induced charge. In many instances, good low-frequency performance is desired from hydrophones (ranging from several Hz to several kHz) because of large transmission loss and the short transmission distance of high-frequency signals in the water. In addition, large dynamic range, low acoustic impedance, and good linearity are also desirable design criteria for a hydrophone.

DETAILED DESCRIPTION

Figure 1A:
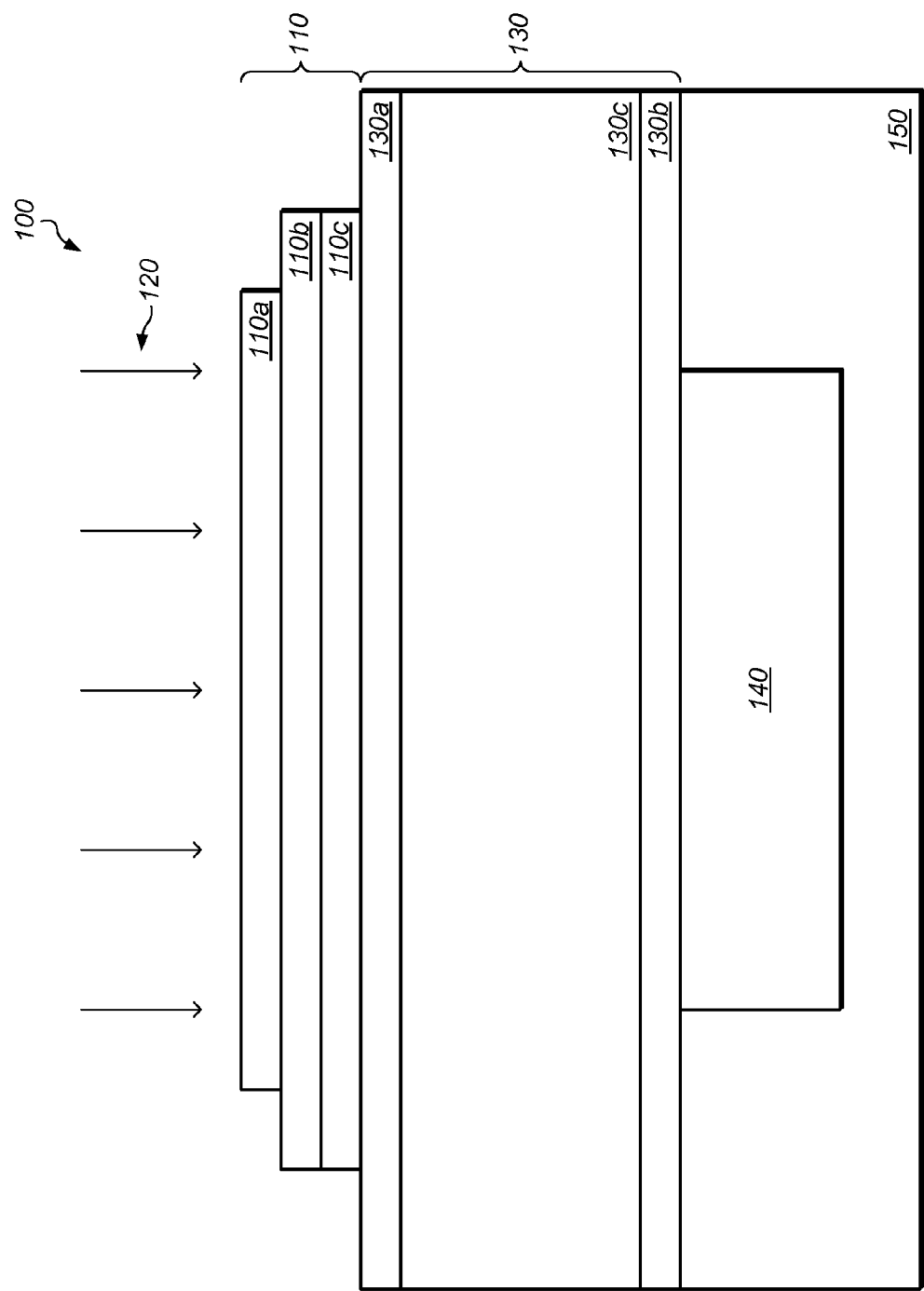
FIGS. 1A and 1B are exemplary embodiments of hydrophones.
Figure 1B:
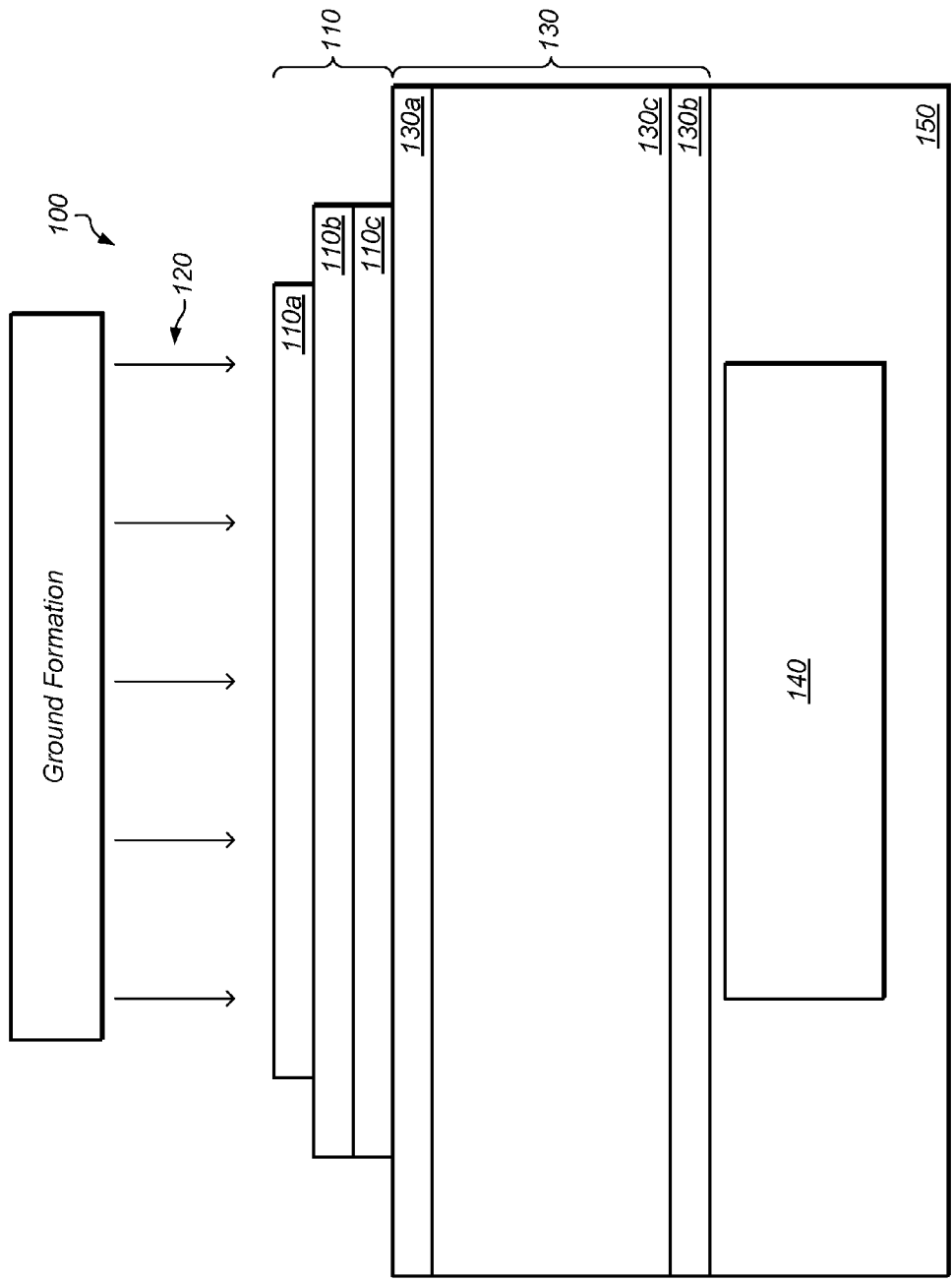

Turning now to FIGS. 1A and 1B, two similar embodiments of a microelectromechanical system (MEMS) hydrophone are shown. As used herein, "MEMS" refers to a technology for miniaturized mechanical and electro-mechanical elements that are made using modified semiconductor device fabrication techniques. A MEMS device, in one embodiment, may be made up of components between about 1 μm to 1 mm in size. The functional elements of MEMS may include miniaturized structures, sensors, actuators, microelectronics, etc. As illustrated, apparatus 100 includes a plurality of layers 110 and 130 disposed on a substrate 150. Apparatus 100, in one embodiment, is a hydrophone; in another embodiment, apparatus 100 includes a hydrophone. In some embodiments, hydrocarbon bearing formations may be located by generating acoustic source signals in a body of water, and then detecting acoustic signals that result, at least in part, from the acoustic source signals interacting with ground formations under the body of water, as shown in FIG. 1B. In one embodiment, cavity 140 is disposed between substrate 150 and support structure layer 130; sensing structure layer 110 is disposed on support structure layer 130.

As shown, in one embodiment, sensing structure layer 110 includes a top electrode layer 110a, a bottom electrode layer 110c, and a piezoelectric layer 110b situated between the two electrode layers 110a and 110c. The term "piezoelectric" has its ordinary and accepted meaning in the art, including a type of material that, when deformed, generates electricity. In one embodiment, piezoelectric layer 110b might be fabricated using aluminum nitride (AlN) to create an AlN piezoelectric layer. In various embodiments, piezoelectric layer 110b may be any piezoelectric material that generates electricity when subjected to an applied stress or strain. Any such piezoelectric material can convert a sound signal into an electrical signal as sound waves generate sound pressure. The sound pressure associated with a sound wave may be caused by the local pressure deviation from the average atmospheric pressure caused by the sound wave. As such, apparatus 100 may be used to measure the sound pressure in water.

In various embodiments, as sound pressure 120 causes piezoelectric layer 110b to deform, electrode layers 110a and 110c may be used to collect the generated electricity. In one embodiment, electrode layers 110a and 110c are placed such that they are disposed on the top and bottom of the piezoelectric material layers 110b; in this manner, electrode layers 110a and 110c are placed such that a maximum charge may be collected from piezoelectric layer 110b. In certain embodiments, electrode layers 110a and 110c may be fabricated using any type of conductor. For example, a conductor can be metal such as aluminum, highly doped silicon, a refractory metal such as tungsten, a silicide, or any other type of conducting material, etc. The electrode layers may be implementing a variety of any materials demonstrating the properties of a conductor.

Below sensing layer 110, in various embodiments, support structure layer 130 is implemented to stabilize the sensitivity of apparatus 100. As is discussed in further detail below, in various embodiments, piezoelectric layer 110 is formed through high-temperature deposition. As a result of the high temperature deposition, residual stress is induced in the deposited material. As used herein, the phrase "residual stress" has its ordinary and accepted meaning in the art, including stresses that remain after an original cause of the stress (e.g., external forces, heat gradient) has been removed. In certain embodiments, due to support layer 130 being dimensioned to be larger than piezoelectric layer 110b, the residual stress in piezoelectric layer 110b has a minimal effect on the sensitivity of apparatus 100. As such, in various embodiments, support structure layer 130 is dimensioned to be larger than piezoelectric layer 110b. In some embodiments, for example, support structure layer 130 is dimensioned to be about 6 μm thick while piezoelectric layer 110b is dimensioned to be about 0.8 μm thick. In various embodiments, the thickness of support structure layer 130 may be at least about 4 μm greater than a thickness of piezoelectric layer 110b. In various embodiments, support structure layer 130 may be larger than about 5 μm thick while piezoelectric layer 110b may be larger than about 0.4 μm thick.

In various embodiments, support structure layer 130 may include a top dielectric layer 130a, a silicon layer 130c, and a bottom dielectric layer 130b. Dielectric layers 130a and 130b may be any dielectric—for example, silicon dioxide ($SiO_2$)—that may be used in dielectric layer 130a to avoid charge leakage from electrode layer 110c. As used herein, the term "dielectric" has its ordinary and accepted meaning in the art, which includes a material that acts like an electrical insulator. In a dielectric, electric charges shift only slightly from their average equilibrium positions when an electric field is applied. Thus, electric charges do not flow through dielectric material as they do in a conductor. As such, dielectric layer 130a may be used as an insulator such that charge collected in electrode layer 110c does not leak into support structure layer 130. In various embodiments, bottom dielectric layer 130b completely bounds the top of vacuum-sealed cavity 140, and is thus used to create this cavity (e.g., by fusion bonding). An exemplary illustration of one fabrication process that is used to fabricate apparatus 100 is discussed further below with respect to FIGS. 6A-J. Note that support structure layer 130 is not limited to the illustrated components. In various embodiments, support structure layer 130 may include different, more, or fewer layers. For example, in certain embodiments, support structure layer 130 may include two dielectric layers, one dielectric layer or no dielectric layers. Support structure layer 130 may also include a single layer including silicon or any other material that may provide the structural support sufficient to minimize the residual stress remaining in piezoelectric layer 110b after a high-temperature deposition process.

Below support structure layer 130, in one embodiment is substrate 150. As shown, substrate 150 is shaped so as to form vacuum-sealed cavity 140 when placed in contact with support structure layer 130. As used herein, the term "substrate" has its ordinary and accepted meaning in the art, which includes the physical material upon which a microdevice or semiconductor device is placed. In various embodiments, substrate 150 is a wafer (i.e., a thin slice of semiconductor material) used in the fabrication of microdevices. In various embodiments, substrate 150 is a silicon wafer. In other embodiments, substrate 150 is a silicon on insulator (SOI) wafer. For example, in some embodiments, the SOI wafer may have a device layer that is about 4 μm deep and a buried oxide layer that is about 1 μm deep.

In the illustrated embodiment, vacuum-sealed cavity 140 is located in substrate 150. Among a variety of factors that may reduce the sensitivity of hydrophone apparatus 100, two such factors are acoustic impedance and noise. One type of noise is Brownian noise, which refers to noise produced by Brownian motion. Brownian motion is commonly considered to be the presumably random movement of particles suspended in a liquid or gas resulting from their bombardment by the fast-moving atoms or molecules in the liquid or gas. In one embodiment, vacuum-sealed cavity 140 is used to reduce Brownian noise—that is, the Brownian noise inside apparatus 100. In certain embodiments, when sensing structure layer 110 vibrates due to sound pressure 120 being applied, Brownian noise may result and be detected by apparatus 100. Accordingly, in some embodiments, the use of vacuum-sealed cavity 140 may minimize the Brownian noise inside apparatus 100. Vacuum-sealed cavity 140 may also be used to reduce acoustic impedance and thus stabilize the sensitivity of hydrophone apparatus 100.

More specifically, the Brownian noise that may be associated with and result in the reduced sensitivity of apparatus 100 may be represented by the following equation:

$$\text{Noise}_{MEMS} = \sqrt{4k_B TD}/S$$

In this equation, $k_B$ is Boltzmann's constant ($1.381 \times 10^{-23}$ J/K); T represents the ambient temperature in K. D represents the damping coefficient in N/(m/s), and S represents the area of a hydrophone diaphragm area in m². In vibration mechanics, damping is an effect (i.e., damping force) that reduces the amplitude of oscillations in an oscillatory system, and this effect is linearly related to the velocity of the oscillations. The damping coefficient is commonly defined as the ratio between the damping force and the oscillating velocity. As can be seen by this equation, the smaller the value of the damping coefficient, the smaller the value of $\text{Noise}_{MEMS}$. In certain embodiments, that damping coefficient may be related to the damping effect of gas which may be very significant in some case. In certain embodiments, the medium in the cavity may comprise different types of gases such as sparse air. Damping may occur from acoustic radiation into air. This damping effect is one of a variety of mechanisms that may limit the sensitivity of apparatus 100.

Thus, in certain embodiments, the value of $\text{Noise}_{MEMS}$ may be controlled by controlling the damping coefficient. In some embodiments, this effect may be achieved by varying the depth and vacuum level of vacuum-sealed cavity 140. For example, we can reduce the damping coefficient by increasing the depth or decreasing the vacuum level of the cavity. Alternatively, in other embodiments, the damping coefficient is controlled by varying the vacuum pressure inside vacuum-sealed cavity 140. As should be appreciated by those skilled in the art with the benefit of this disclosure, as the cavity pressure decreases (i.e., the vacuum level increases), the damping coefficient (D) decreases. Thus, as the vacuum level in the vacuum-sealed cavity 140 is increased, Brownian noise will decrease.

Vacuum-sealed cavity 140 may also be effective in maintaining stable acoustic impedance. Acoustic impedance indicates how much sound pressure is generated by the vibration of molecules of a particular acoustic medium at a given frequency. Certain hydrophones that do not have a vacuum-sealed cavity may experience an increase in backside acoustic impedance as a hydrophone is placed deeper in the ocean. The increase in backside acoustic impedance may result in decreased sensitivity. In one embodiment, the acoustic impedance in vacuum-sealed cavity 140 is directly correlated to the density of air in cavity 140 and an acoustic speed. As both the density of air and acoustic speed remain almost unchanged in a sealed cavity, the acoustic impedance of the cavity is maintained at a stable level regardless of the depth of the hydrophone. As such, in certain embodiments, vacuum-sealed cavity 140 is effective in maintaining stable acoustic impedance, as well as in reducing Brownian noise. In some embodiments, Brownian noise may be reduced to an insignificant level (e.g., about 3.5E-6 μBar/√Hz or less), regardless of the depth of apparatus 100.

Accordingly, as the depth and pressure of vacuum-sealed cavity 140 are used to control the damping coefficient (D), in some embodiments, vacuum-sealed cavity 140 is calibrated such that it has a depth of about 2 μm and a pressure of about 0.1 mBar. In various embodiments, vacuum-sealed cavity 140 has a depth ranging from about 1 μm to 10 μm. In other embodiments, the vacuum pressure is between about 0.1 mBar and 10 mBar (e.g., 1 mBar).

In certain embodiments, vacuum-sealed cavity 140 is placed directly below oxide layer 130b. Oxide layer 130 may thus form a boundary of vacuum-sealed cavity 140. In other embodiments, instead of oxide layer 130b forming a boundary of vacuum-sealed cavity 140, vacuum-sealed cavity 140 may be bounded completely by substrate 150. For example, the top boundary of vacuum-sealed cavity 140 may be about 0.5 μm to 1 μm away from the bottom of oxide layer 130b. Simulated results showing a correlation between the depth of vacuum-sealed cavity 140 and the damping coefficient is shown in FIG. 2.

Figure 2:
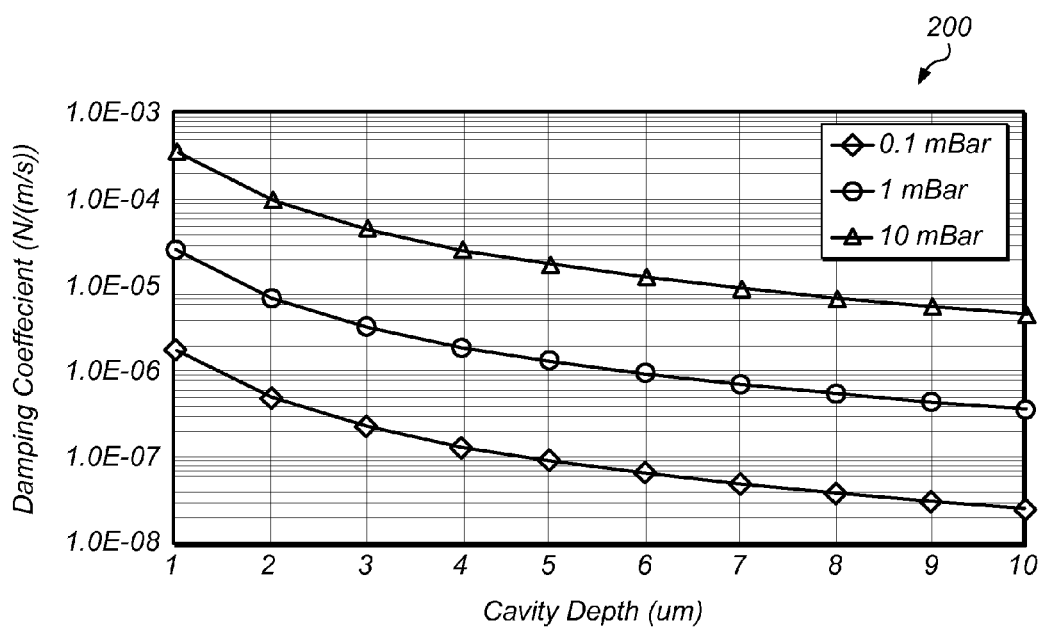
FIG. 2 is a chart illustrating the relationship between an exemplary damping coefficient and the depth of a vacuum-sealed cavity of an exemplary hydrophone.

Turning now to FIG. 2, an exemplary relationship between damping coefficient (D) and the depth of the vacuum-sealed cavity of an exemplary hydrophone is shown. As is illustrated in chart 200, the depth of vacuum-sealed cavity (e.g., cavity 140), is plotted along the horizontal axis. The damping coefficients calculated through simulations are plotted along the vertical axis using a log scale in base 10. The damping coefficients for three different vacuum levels in a vacuum-sealed cavity are shown. As can be seen, as the cavity depth is increased, the resulting damping coefficient decreases. As should be appreciated by persons skilled in the art with the benefit of this disclosure, the simulated results illustrate that a vacuum-sealed cavity with a depth of 2 µm results in a damping coefficient that is sufficiently low enough to enable the vacuum-sealed cavity to maintain Brownian noise at a manageable level. In one embodiment, a vacuum-sealed cavity dimensioned to have a depth of 2 µm may reduce the Brownian noise of a single hydrophone apparatus 100 to a manageable level (e.g., only 5E-6 µBar/√Hz at 300K).

Referring back to FIGS. 1A and 1B, as was previously discussed, as sound pressure interacts with sensing structure layer 110, it causes the piezoelectric layer 110b to deform. The charge generated by the deformation of layer 110b is collected at designated electrodes, such as electrode layers 110a and 110c. In certain embodiments, electrode layer 110a is dimensioned in relation to piezoelectric layer 110b such that a maximum induced charge is achieved. This is discussed below with regard to FIG. 3.

Figure 3:
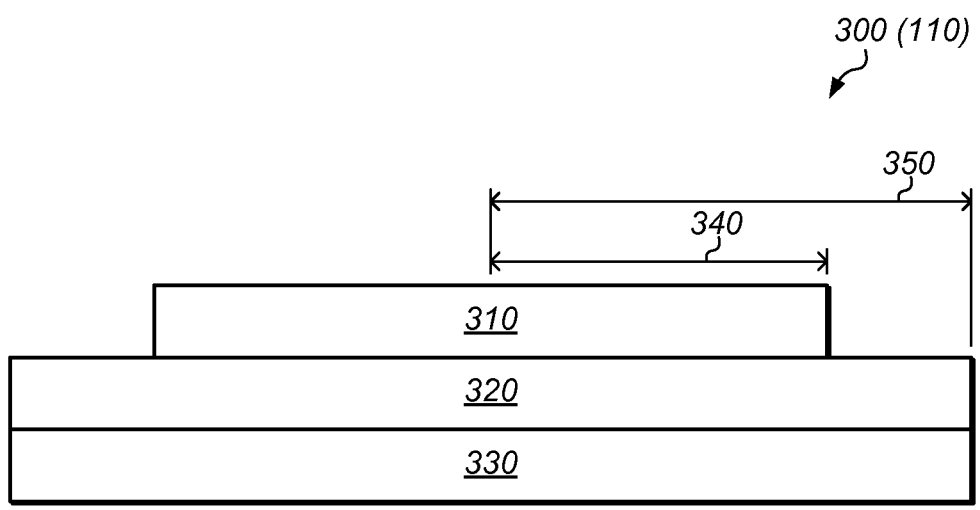
FIG. 3 illustrates a detailed cross-section view of the sensing structure of one embodiment of the hydrophone.

Turning now to FIG. 3, a detailed cross-section of a sensing structure 300 is shown. In some embodiments, sensing structure 300 is the same as sensing structure layer 110 discussed with reference to FIGS. 1A and 1B (e.g., layers 310-330 correspond to layers 110a-c in FIGS. 1A and 1B). In various embodiments, top electrode layer 310 is dimensioned such that a maximum induced charge is achieved. As was discussed previously with regards to FIGS. 1A and 1B, these electrode layers may be fabricated using any material that conducts electricity. In certain embodiments, electrode layers 310 and 330 may be fabricated using any material that may act as an electrical conductor, and may be used to make contact with a nonmetallic part of a device.

In certain embodiments, a maximum induced charge is achieved by dimensioning top electrode layer 310 relative to piezoelectric layer 320. As indicated in FIG. 3, distances 340 and 350 are shown. Distance 340 is indicative of half of the width of top electrode layer 310 (FIG. 3 shows a cross-sectional width of structure 300). Similarly, distance 350 is representative of half the width of piezoelectric layer 320. In various embodiments, the shape of the various electrodes, piezoelectric layers and the various components of the sensing structure may differ. For example, in one embodiment, top electrode layer may be implemented in a circular shape. In such cases, distance 340 is representative of the radius of top electrode layer 310. Similar comments apply to distance 350 relative to piezoelectric layer 320. In other embodiments, the layers of structure 300 may be implemented as other shapes (e.g., quadrilaterals). In such case, distances 340 and 350 are representative of half the cross-sectional width of these layers.

In some embodiments, the difference in size between the various components of the sensing structure may be described by area. For example, in one particular embodiment, a maximum induced charge is achieved by dimensioning top electrode layer 310 such that its surface area is smaller than that of the surface area of piezoelectric layer 320. For example, in certain embodiments, the top electrode is dimensioned such that the surface area of top electrode layer 310 is between about 70 and 90 percent of the surface area of piezoelectric layer 320 (i.e., a 310-to-320 surface area ratio between about 70 and 90 percent). In one particular embodiment, the area of top electrode layer 310 is approximately 77 percent of piezoelectric layer 320 (i.e., within plus or minus 1 percent of 77 percent). In a particular embodiment in which various components are implemented in circular shape, distance 340 is about 88 percent of distance 350. In another specific embodiment, top electrode layer 310 is dimensioned such that distance 340 is about 100 lam and piezoelectric layer 320 is dimensioned such that distance 350 is about 125 µm.

The disclosed ranges are non-limiting and exemplary in nature. Embodiment may utilize a range that includes a portion of the disclosed range or falls outside the range. For example, some embodiments may have an area ratio that is lower than about 70 percent. Others may have an area ratio that is greater than about 90 percent.

Figure 4A:
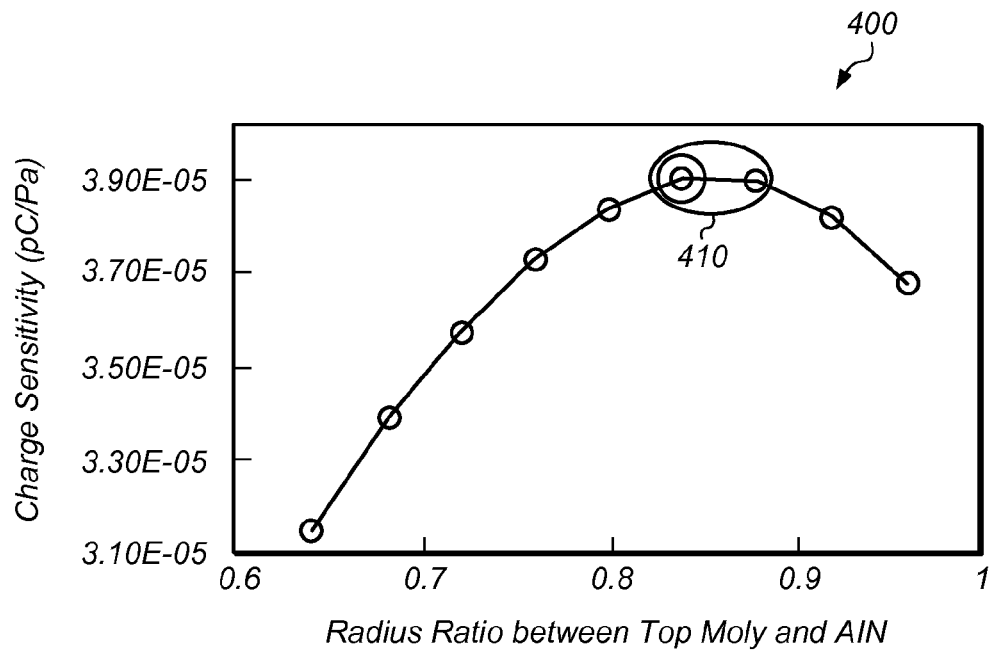
FIGS. 4A-B are charts illustrating the relationship between charge sensitivity and the radius ratio between a top electrode and an adjacent piezoelectric layer of one embodiment of a hydrophone.

Turning now to FIG. 4A, simulated results show the variation in charge sensitivity as the radius ratio between an exemplary top electrode and an adjacent piezoelectric layer is varied. Top electrode and an adjacent piezoelectric layer may be electrode layer 310 and piezoelectric layer 320 as discussed with reference to FIG. 3. As is illustrated in chart 400, the radius ratio is plotted along the horizontal axis and the charge sensitivity is plotted along the vertical axis. Generally, a higher charge sensitivity is desired and is directly correlated to the amount of induced charge. As is illustrated in chart 400, at points 410, a maximum induced charge is achieved at the radius ratio of approximately 88 percent. In embodiments in which the sensing components have a circular shape, this radius ratio translates to an area ratio of 77 percent. Thus in various embodiments of a hydrophone, the respective layers in the sensing structure can be dimensioned such that a maximum induced charge is realized.

Figure 4B:
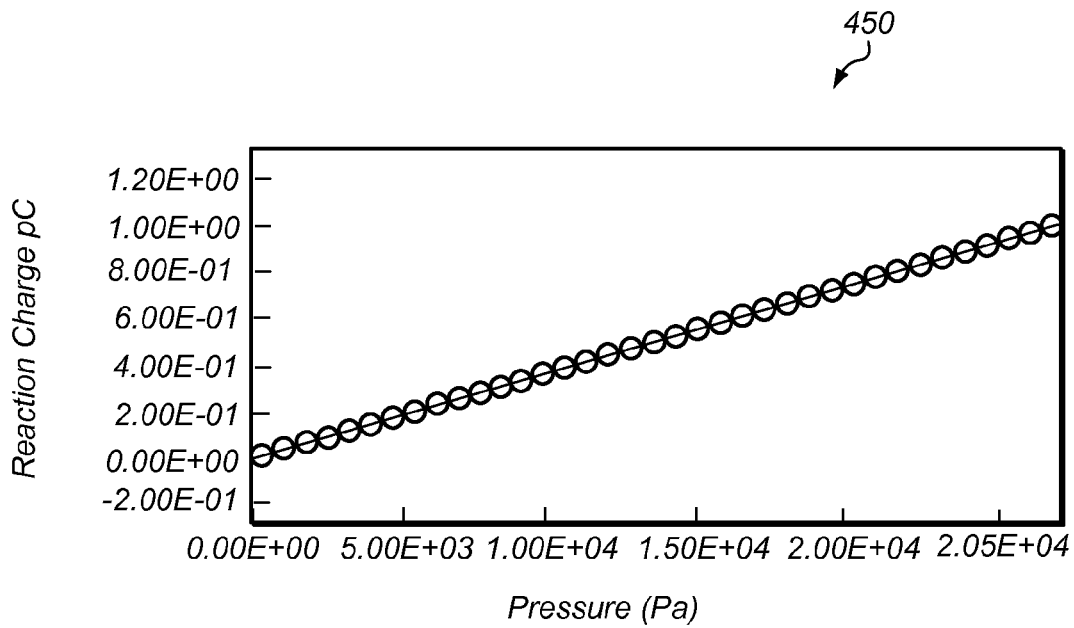

Turning now to FIG. 4B, chart 450 shows the simulated results of the induced charge resulting from a sensing structure dimensioned as discussed with reference to FIG. 3. Chart 450 demonstrates the approximate linear relationship between an acoustic pressure, such as sound pressure 120 as discussed with reference to FIGS. 1A and 1B, and the resultant induced charge. The simulated sensitivity demonstrates a sensitivity of about 3.83E-5pC/Pa in hydrophone apparatus 100. As can be seen in chart 450, the greater the amount of pressure that is applied to hydrophone apparatus 100, the greater the measured charge. In some embodiments, the induced charge generated by a single hydrophone, however, may be insufficient to be detected by certain preamplifiers. In various embodiments, a preamplifier may be used to prepare small electrical signals for further amplification or processing.

Figure 5:
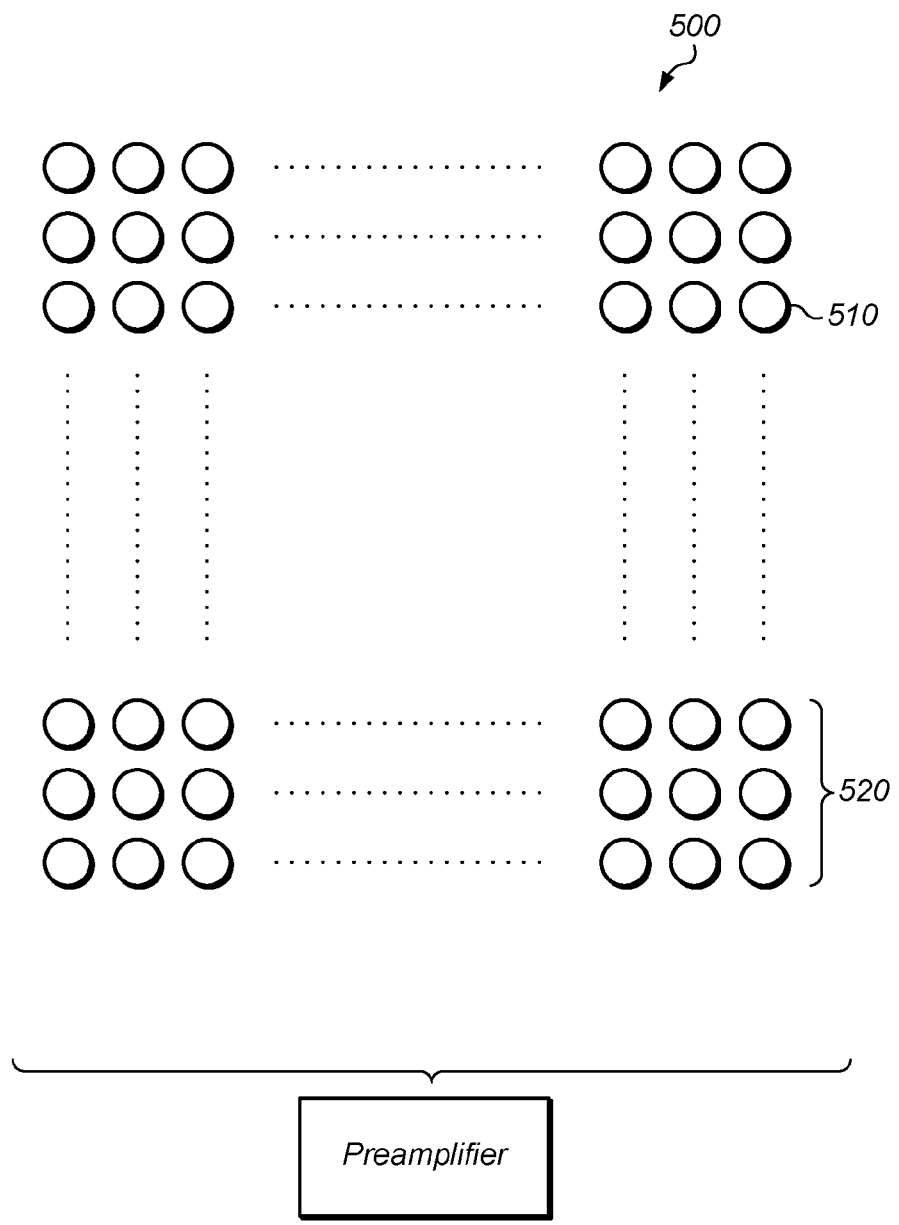
FIG. 5 illustrates one possible arrangement of hydrophones arranged in an array.

Turning now to FIG. 5, one arrangement of hydrophones in an array 500 is shown. Although the arrangement in FIG. 5 is shown as square, this arrangement may take any form (e.g., circular, octagonal). This arrangement of hydrophones in an array with a plurality of rows and columns allows individual charge generated by each hydrophone 510 to be accumulated. The accumulated charge results in a sufficient amount of charge that can be detected by a preamplifier. As shown, hydrophones may be placed in an array of three (3) by three (3) to form a cell 520. In some embodiments, an array of four (4) by four (4) hydrophones may be placed in one cell. Array 500 is not limited to these illustrated dimensions; it may contain different, more, or fewer elements than those illustrated in FIG. 5. The array's design is aimed to improve the sensitivity of the hydrophone. As the improved sensitivity is correlated to the sum of each cell's charge, any number of hydrophones might be arranged in any manner such that a desired sensitivity level is acquired. In some embodiments, array 500 may contain a minimum number of hydrophones needed to provide an accumulated amount of charge that is sufficient to meet the specifications of a variety of preamplifiers that may be used to detect and amplify charge.

Figure 6A:
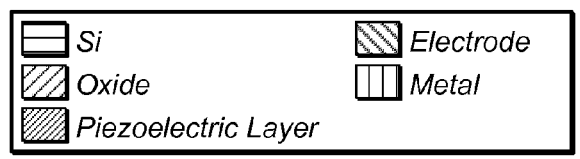
FIGS. 6A-J illustrate an exemplary process flow for the fabrication of a hydrophone.
Figure 6A:
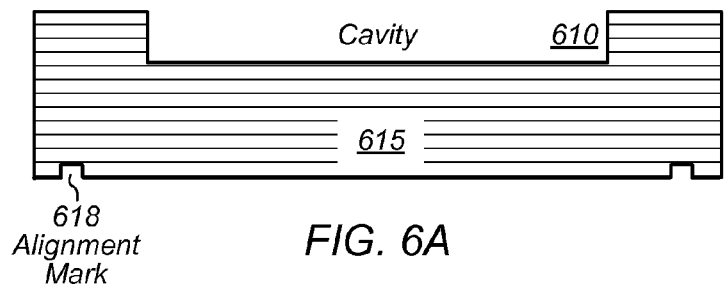
Figure 6B:
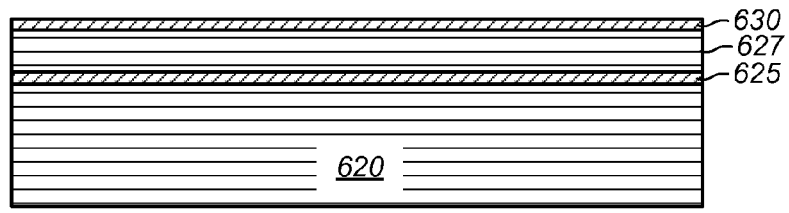

Turning now to FIGS. 6A-J, an exemplary set of fabricating steps that may be used to fabricate the disclosed hydrophone (e.g., apparatus 100 discussed above with reference to FIGS. 1A and 1B) is shown. As should be appreciated by persons skilled in the art with the benefit of this disclosure, various fabrication techniques may be used to fabricate the various disclosed embodiments of a hydrophone. As shown in FIG. 6A, in one exemplary flow, the process starts with a double-sided polished wafer 615. Alignment marks 618 are etched on to the backside of wafer 615 and a cavity 610 is etched on the front side of wafer 615. In FIG. 6B, a different silicon-on-insulator (SOI) wafer 620 is used. In this embodiment, SOI wafer 620 has a 1 µm buried oxide layer (625) and a 4 µm device layer (627). Dielectric material is deposited as a 1 µm layer 630 on the front side of wafer 620. In a subsequent processing step, layers 625, 627 and 630 may comprise the support structure (e.g. support structure layer 130 discussed above with reference to FIGS. 1A and 1B). As was discussed previously, in some embodiments, dielectric layer 630 is composed of silicon dioxide. Dielectric layer 630 may be deposited on wafer 620 to act as an isolation layer to avoid charge leakage from an adjacent electrode layer. In some embodiments, dielectric layer 630 is produced using the microfabrication technique known as thermal oxidation. As is appreciated by those skilled in the art, various fabrication techniques may be used to etch and fabricate various dielectric layers on various wafers.

Figure 6C:
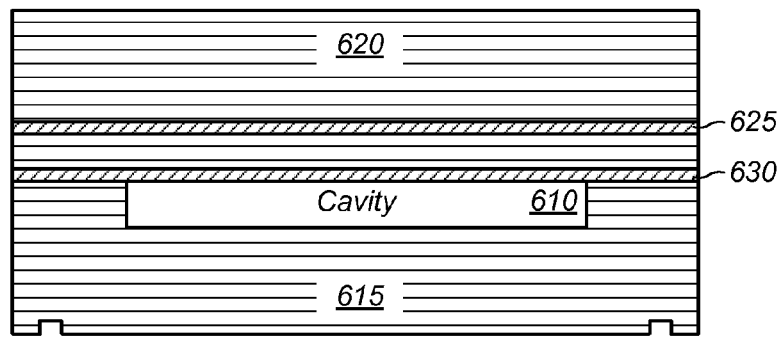
Figure 6D:
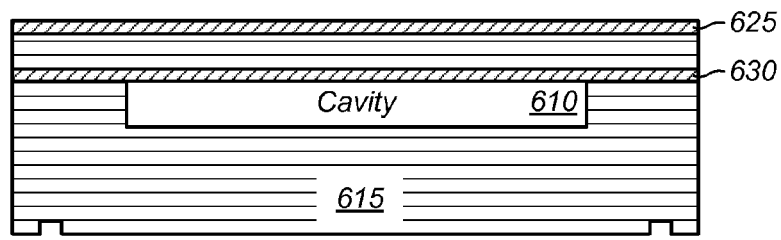
Figure 6E:
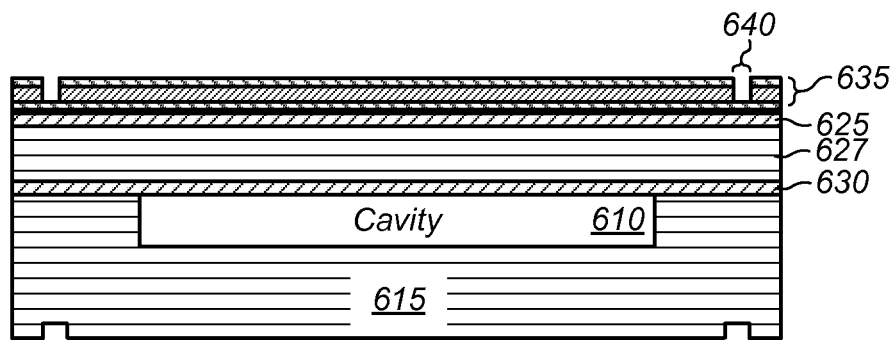

Turning to FIG. 6C, wafers 615 and 620 are bonded together in one embodiment to create vacuum-sealed cavity 610 using fusion bonding. In FIG. 6D, the handle layer of wafer 620 is removed for subsequent processing of wafer 620. In FIG. 6E, a very thin piezoelectric seed layer, a bottom electrode layer, a piezoelectric layer and a top electrode layer are sputtered on buried oxide layer 625 sequentially to form sensing structure 635. In certain embodiments, the piezoelectric layer is formed by depositing aluminum nitride particles using a high temperature deposition technique. Due to the high temperature deposition, residual stress is induced in the piezoelectric material because the original cause of the stress (e.g., heat) is removed after the high temperature deposition is complete. As a thick support layer is implemented (e.g., layers 625, 627 and 630), the impact of the residual stress on the sensitivity of the hydrophone is minimal. In some embodiments, alignment marks 640 are also transferred from the backside to the front side to ensure further alignment during subsequent lithography steps.

Figure 6F:
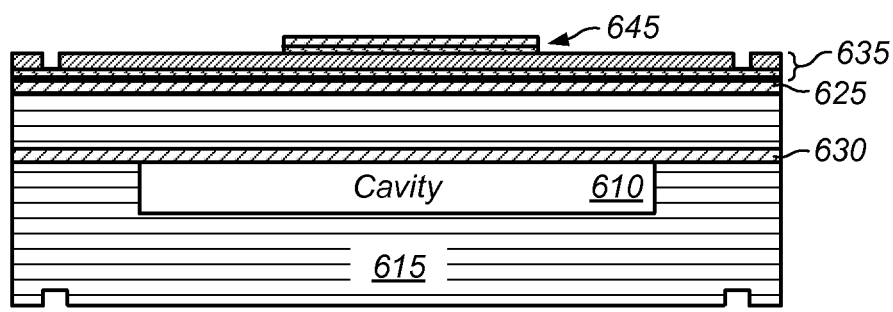
Figure 6G:
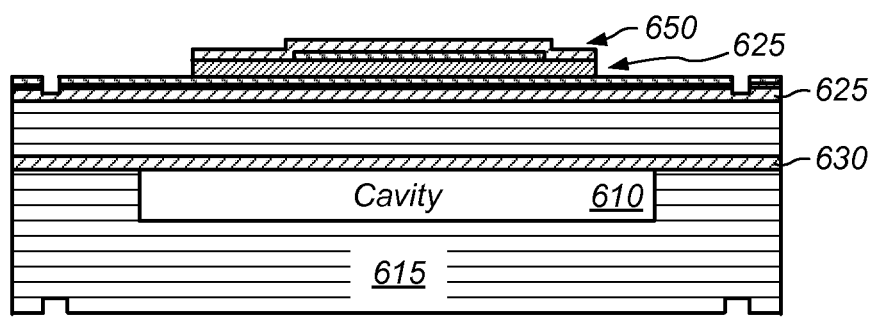

Moving on to FIG. 6F, a thin layer of oxide is deposited using a plasma-enhanced chemical vapor deposition (PECVD) process. The oxide is patterned as a hard mark to prepare for etching the top electrode. This mask should align to previous alignment marks and stop at the piezoelectric layer. This step may be used to dimension the top electrode such that its radius is smaller than the radius of the adjacent piezoelectric layer below it. In FIG. 6G, another oxide layer 650 may be deposited using PECVD oxide deposition. This layer is further patterned and etched such that piezoelectric layer 625 is dimensioned such that an area ideal ratio (i.e. 77 percent) is achieved between the ratio of the area between the top electrode and adjacent piezoelectric layer. At this point, the structure of the sensing layer is established and dimensioned such that a maximum amount of induced charge is achieved.

Figure 6H:
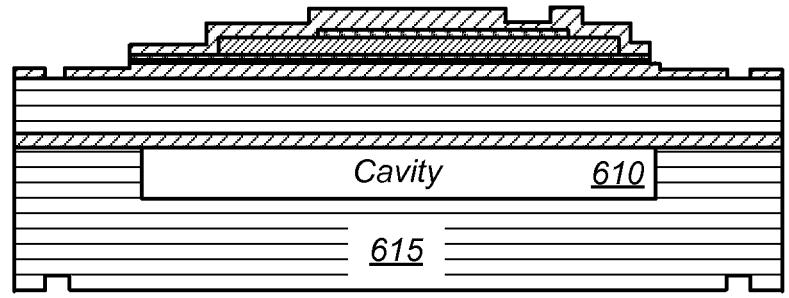
Figure 6I:
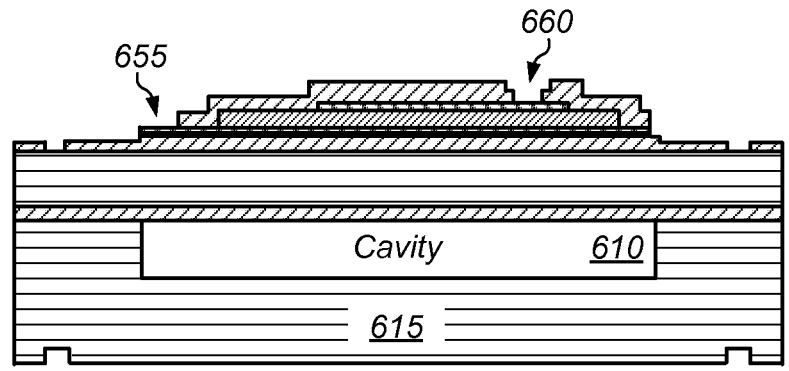
Figure 6J:
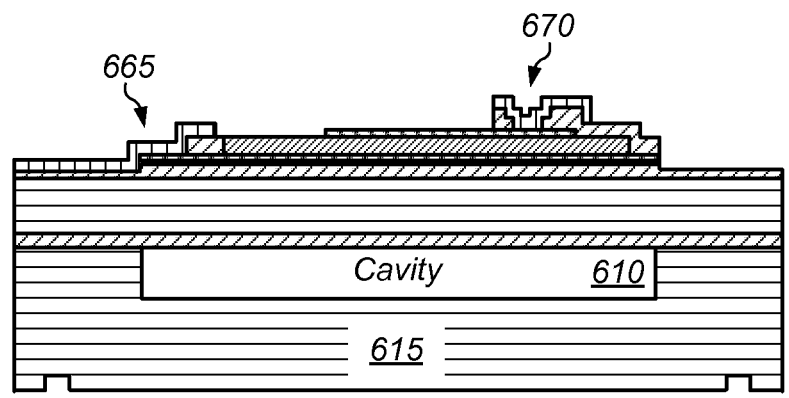

In FIG. 6H, another layer of oxide is deposited using PECVD oxide deposition. This oxide layer is subsequently patterned and etched to the bottom electrode. In FIG. 6I, a thick PECVD oxide layer is deposited and patterned to open up contacts 655 and 660 for both the top and bottom electrodes. Finally, in FIG. 6J, a metal layer is deposited and patterned on the front side to form metal pads 670 and 665. As should be appreciated by those skilled in the art with the benefit of this disclosure, these metal pads may be used to measure the charge generated by the deformation of the piezoelectric layer and collected by the electrode layers.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a substrate that includes a vacuum-sealed cavity;
   a support structure situated on the substrate; and
   an acoustic pressure sensor situated on the support structure;
   wherein the support structure includes:
      a first dielectric layer situated on the substrate;
      a silicon layer situated on the first dielectric layer; and
      a second dielectric layer situated on the silicon layer.

2. The apparatus of claim 1, wherein the first dielectric layer is a first oxide layer, and wherein the second dielectric layer is a second oxide layer.

3. The apparatus of claim 1, wherein the acoustic pressure sensor includes:
   a first electrode layer situated on the support structure;
   a piezoelectric layer situated on the first electrode layer; and
   a second electrode layer situated on the piezoelectric layer;
   wherein the apparatus is configured to measure an acoustic wave received at the pressure sensor.

4. The apparatus of claim 1, wherein the acoustic pressure sensor includes:
   a first electrode layer disposed on the support structure;
   a piezoelectric layer disposed on the first electrode layer; and
   a second electrode layer disposed on the piezoelectric layer.

5. The apparatus of claim 1, wherein a portion of the support structure forms one boundary of the vacuum-sealed cavity.

6. The apparatus of claim 1, wherein the vacuum-sealed cavity is completely bounded by the substrate.

7. The apparatus of claim 4, wherein a thickness of the support structure is at least 4 µm greater than a thickness of the piezoelectric layer.

8. The apparatus of claim 4, wherein an area of the second electrode layer is between 70 to 90 percent of an area of the piezoelectric layer.

9. The apparatus of claim 1, wherein the apparatus is a hydrophone.

10. A method, comprising:
measuring a pressure of an acoustic signal received at a sensor of a device located in a body of water, wherein the device includes a support structure situated between a vacuum-sealed cavity included in a substrate and the sensor, wherein the support structure includes:
a first dielectric layer situated on the substrate;
a silicon layer situated on the first dielectric layer; and
a second dielectric layer situated on the silicon layer.

11. The method of claim 10, wherein the sensor includes a top electrode layer and a piezoelectric layer, and wherein an area of the top electrode layer is 70 to 90 percent of an area of the piezoelectric layer.

12. The method of claim 10 wherein the acoustic signal results from an acoustic source signal interacting with a ground formation under the body of water.

13. An apparatus, comprising:
a plurality of hydrophones configured to perform underwater acoustic signal detection, wherein at least one of the plurality of hydrophones includes a vacuum-sealed cavity;
wherein the at least one hydrophone includes a sensor and a support structure, wherein the sensor is configured to receive an acoustic signal, and wherein the support structure includes:
a first dielectric layer situated on a substrate;
a silicon layer situated on the first dielectric layer; and
a second dielectric layer situated on the silicon layer, wherein the second dielectric layer is in contact with the sensor.

14. The apparatus of claim 13, wherein the first dielectric layer is a first oxide layer.

15. The apparatus of claim 13, wherein the second dielectric layer is a second oxide layer.

16. The apparatus of claim 13, wherein the vacuum-sealed cavity is bounded by both the substrate and the first dielectric layer.

17. The apparatus of claim 13, wherein the vacuum-sealed cavity is completely bounded by the substrate.

18. The apparatus of claim 13, wherein the plurality of hydrophones are arranged in an array having a plurality of rows and a plurality of columns, wherein the plurality of hydrophones generate an accumulated charge sufficient to be detected by a preamplifier.

19. The apparatus of claim 13, wherein a thickness of the support structure is 4 µm or more greater than a thickness of the sensor.

20. The apparatus of claim 13, wherein the sensor includes a first electrode layer in contact with the support structure, a piezoelectric layer in contact with the first electrode layer, and a second electrode layer in contact with the piezoelectric layer.

21. The apparatus of claim 20, wherein a surface area of the second electrode layer is 70 to 90 percent of a surface area of the piezoelectric layer.

\* \* \* \* \*